(12) United States Patent
Lin et al.

(10) Patent No.: US 6,348,714 B1
(45) Date of Patent: Feb. 19, 2002

(54) SOI STRUCTURE WITH A BODY CONTACT

(75) Inventors: Hongchin Lin, Taipei; Shyh-Chyi Wong, Taichung, both of (TW)

(73) Assignee: Windbond Electronics Corp., Hsinchu (TW)

( * ) Notice: Subject to any disclaimer, the term of this patent is extended or adjusted under 35 U.S.C. 154(b) by 0 days.

(21) Appl. No.: 09/579,941

(22) Filed: May 26, 2000

(30) Foreign Application Priority Data

Apr. 19, 2000 (TW) .......................................... 089107354

(51) Int. Cl.[7] ............................................... H01L 27/01
(52) U.S. Cl. ........................ 257/347; 438/149; 438/479; 438/517
(58) Field of Search .......................... 257/347; 438/149, 438/479, 517

(56) References Cited

U.S. PATENT DOCUMENTS

| | | | | |
|---|---|---|---|---|
| 5,141,889 A | * | 8/1992 | Terry et al. .................. | 437/31 |
| 6,020,615 A | * | 2/2000 | Lee ............................. | 257/350 |
| 6,031,261 A | * | 2/2000 | Kang .......................... | 257/302 |
| 6,043,535 A | * | 3/2000 | Houston ...................... | 257/345 |
| 6,071,803 A | * | 6/2000 | Rutten et al. ............... | 438/618 |
| 6,107,125 A | * | 8/2000 | Jaso et al. ................... | 438/149 |
| 6,180,985 B1 | * | 1/2001 | Yeo ............................. | 257/354 |

* cited by examiner

*Primary Examiner*—Eddie Lee
*Assistant Examiner*—Eugene Lee
(74) *Attorney, Agent, or Firm*—J.C. Patents

(57) ABSTRACT

A SOI device structure is formed on a SOI substrate having a body contact. The SOI substrate has an insulating layer thereon and a silicon layer is disposed on the insulating layer. A gate is disposed on the silicon layer. A source region and a drain region are respectively disposed within the silicon layer beside the gate. A body contact is provided at an interface between the insulating layer and the silicon layer wherein the body contact is preferably located between the source region and the gate. The body contact, disposed between the source region and the gate can reduce kink effect and body effect, thereby enhancing the performance of device formed on SOI.

6 Claims, 11 Drawing Sheets

SOI STRUCTURE WITH A BODY CONTACT

CROSS-REFERENCE TO RELATED APPLICATION

This application claims the priority benefit of Taiwan application serial no. 89107354, filed Apr. 19, 2000.

BACKGROUND OF THE INVENTION

1. Field of Invention

The present invention relates to a device formed on a silicon-on insulator (SOI). More particularly, the present invention relates to a MOSFET formed on a SOI with a body contact.

2. Description of Related Art

SOI structure can provide better isolation structure than that of conventional device such that some effects such as latch-up or substrate coupling effect can be eliminated or reduced. SOI structure also can reduce parasitic capacitance due to junction capacitance and be applicable of small-area high-integration and high-speed devices. Based on the advantages as mentioned above, SOI becomes an important semiconductor technology currently and it has been developed various MOS transistor formed on SOI wherein full-depleted MOS transistor is the most popular device.

Full-depleted MOS transistor has high current driven ability and is capable of reducing channel effect and hot carrier degradation. However, floating substrate of MOS transistor formed on SOI causes some problems such as kink effect, abnormal sub-threshold slope, low breakdown voltage, or latch effect due to lateral parasitic BJT.

SUMMARY OF THE INVENTION

The invention provides a SOI structure having a body contact, thereby reducing body effect and enhancing performance of circuits.

As embodied and broadly described herein, the invention provides a device structure formed on a SOI substrate having a body contact. The SOI substrate has an insulating layer thereon and a silicon layer is disposed on the insulating layer. A gate is disposed on the silicon layer. A source region and a drain region are respectively disposed within the silicon layer beside the gate. A body contact is provided at an interface between the insulating layer and the silicon layer wherein the body contact is preferably located between the source region and the gate. The body contact, disposed between the source region and the gate, can reduce kink effect and body effect, thereby enhancing the performance of device formed on SOI.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

wherein $V_g$ represents gate voltage, $I_d$ represents drain current, $V_d$ represents drain voltage and $I_{sub}$ represents body contact 116 current.

DESCRIPTION OF THE PREFERRED EMBODIMENTS

The better way to enhance the characteristic of MOS transistor formed on SOI is body contact. A lot of structures with body contact, such as T-gate structure, body connecting source region with reduced source region width, body connecting source region having P+buried layer under N+source region, field-shield isolation structure. source-drain rain region structure with germanium dopants or body contact structure with LOCOS isolation structure have been developed. However, such structures cannot efficiently collect holes and may increase junction capacitance. Therefore, this invention provides a body contact formed at an interface between a buried oxide layer and a silicon layer, thereby reducing body current.

Figure 1:
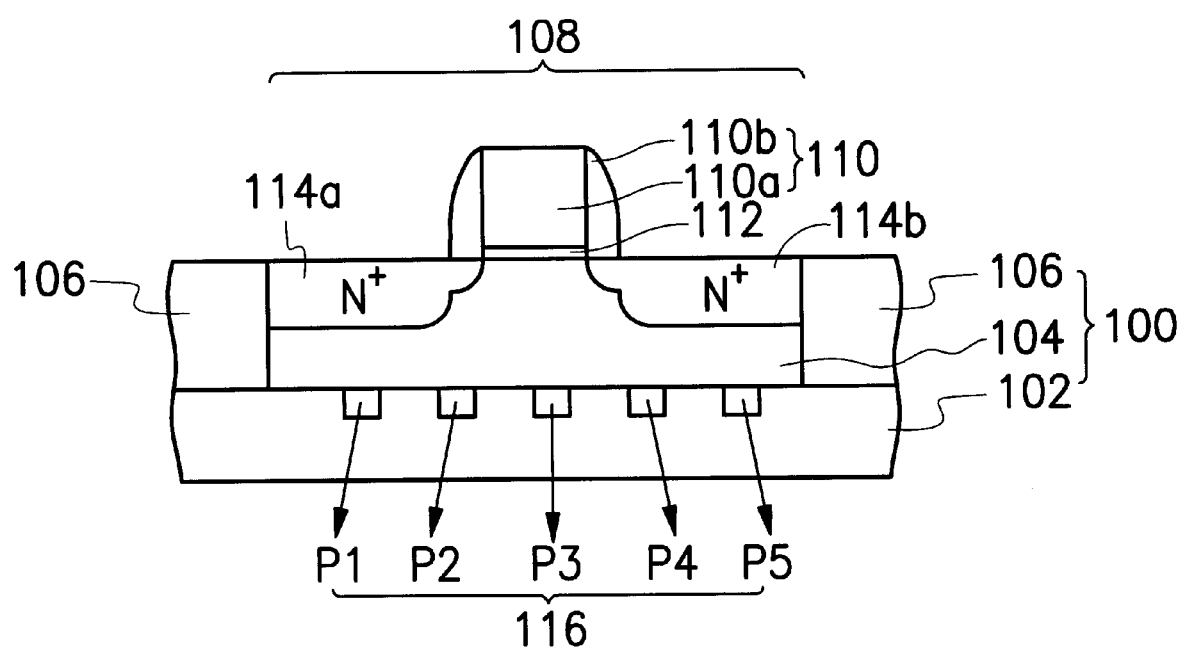
FIG. 1 shows a SOI structure having body contact according to one preferred embodiment of this invention.

FIG. 1 shows a SOI structure having body contact according to one preferred embodiment of this invention. Referring to FIG. 1, a SOI substrate 100 is to form a silicon layer 104 on an insulating layer 102. The silicon layer 104 is defined by isolation structures 106 such as shallow trench isolation (STI) to form active area 108. The active area 108 has a gate 110 including a conductive layer 110a and an insulating spacer 110b formed thereon. The conductive layer 110a is insulated with the silicon layer 104 by a gate oxide layer 112. The silicon layer 104 beside the gate 110 has a source region 114a and a drain region 114b formed which the regions also include a lightly doped region and a heavily doped region. A body contact, composed of conductive material such as polysilicon or silicide, is disposed at an interface between the silicon layer 104 and the insulating layer 102, and is partially adjacent the silicon layer 104.

The body contact 116 can be disposed at different positions such as P1, P2, P3, P4, and P5 within the insulating layer 102 so as to analyze the effect to the device by virtue of detecting drain current or body contact current. P1 represents that the body contact is near the source region 114a, P2 represents between the source region 114a and the gate 110, P3 represents beneath the gate 110, P4 means between the drain region 114b and the gate 110, and P5 is beneath the drain region 114b.

Figure 2A:
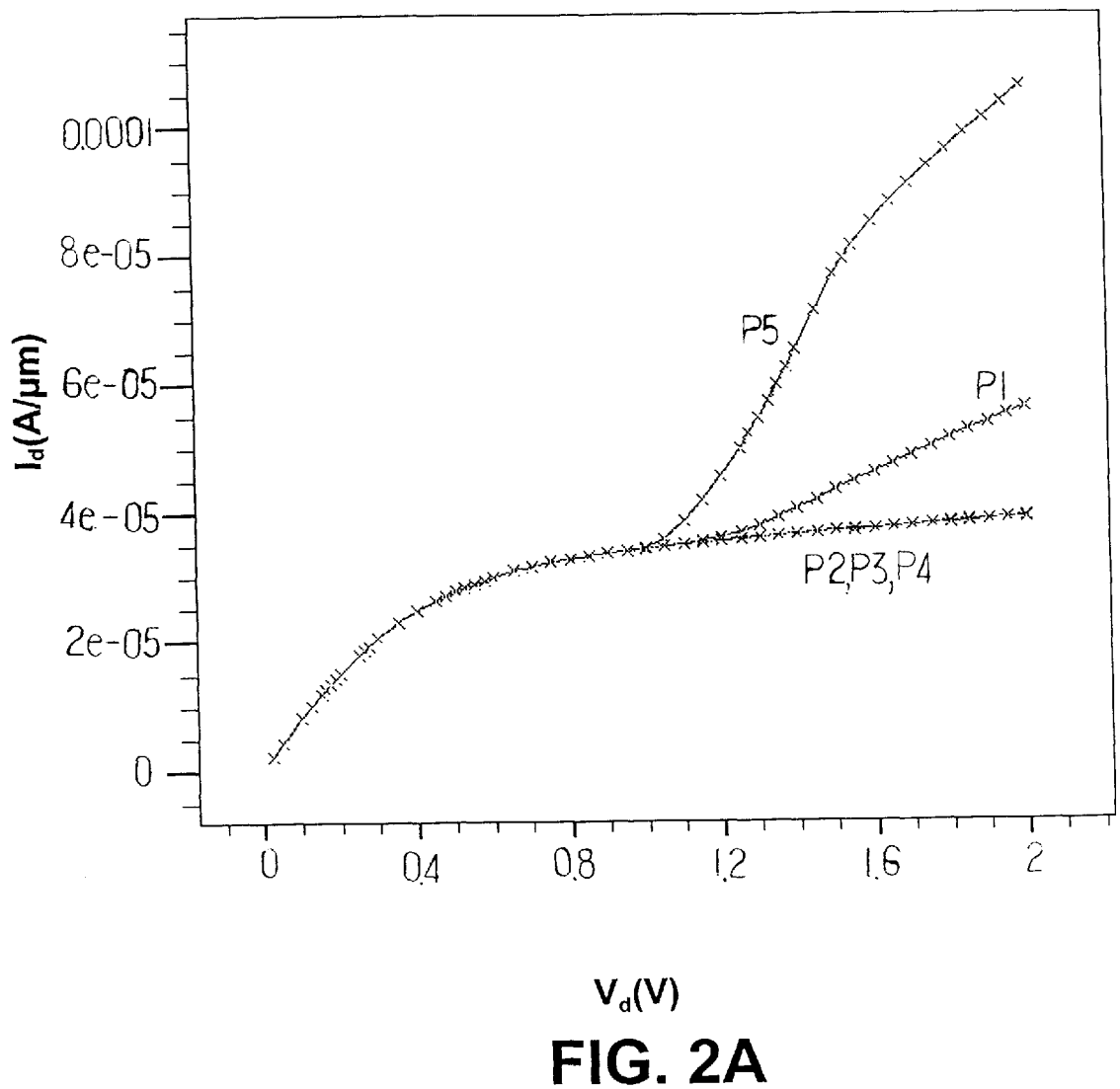
FIGS. 2A–2B, respectively, shows $I_d$–$V_d$ simulated data when a body contact of FIG. 1 is located at different position from P1 to P5 for partially-depleted and full depleted N-type MOS transistor formed on SOI when $V_g$=2V.
Figure 2B:
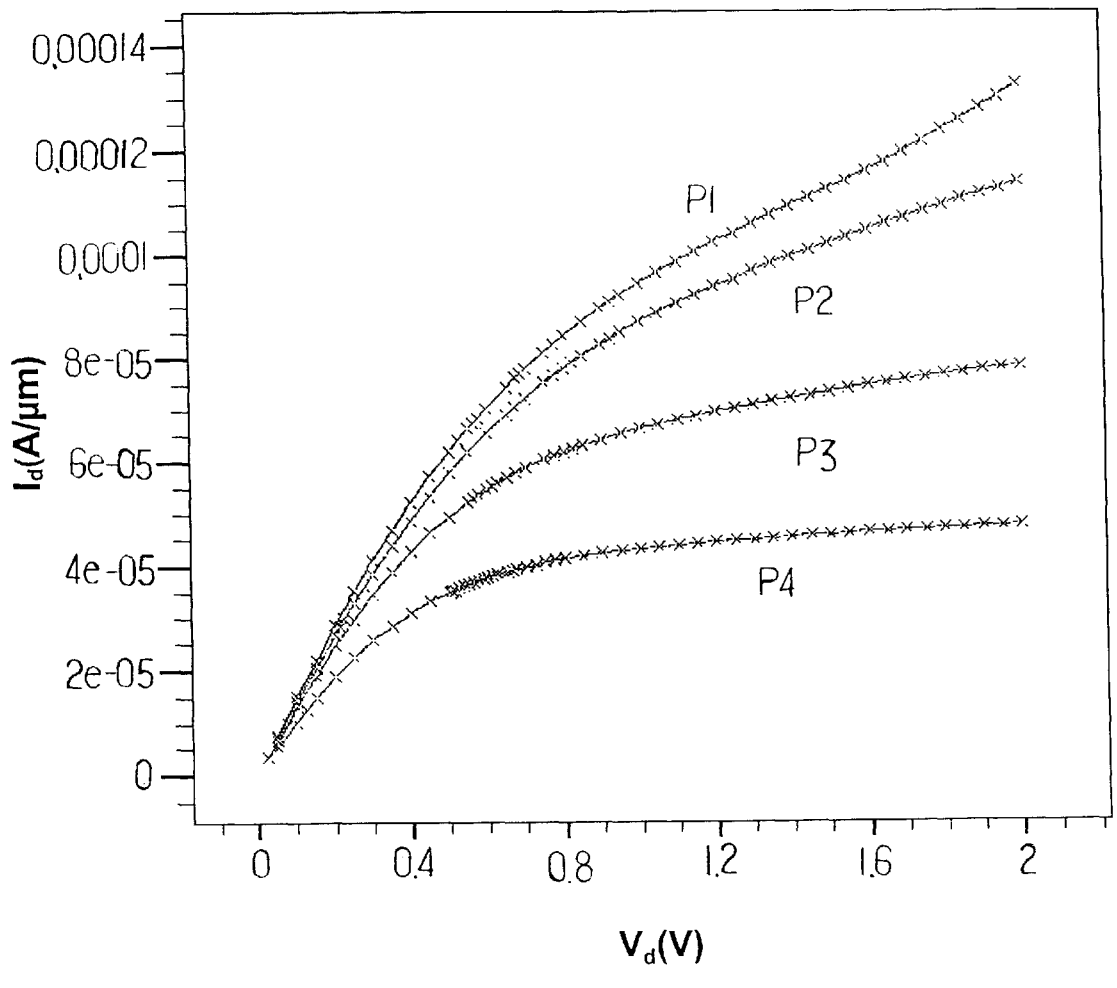

FIG. 2A–2B respectively, shows $I_d$–$V_d$ simulated data when a body contact of FIG. 1 is located at different position from P1 to P5 for partially-depleted and fully-depleted N-type MOS transistor formed on SOI when $V_g$=2V. The silicon layer 104 with a thickness of 1250 angstrom serves as a partially-depleted N-type MOS transistor and the silicon layer 104 with a thickness of 450 angstrom serves as a full-depleted N-type MOS transistor wherein $V_g$ represents gate voltage, $I_d$ represents drain current and $V_d$ represents drain voltage. As shown in FIG. 2A. when the body contact 116 is disposed at P1 or P5, the kink effect occurs, however, there is no kink effect when the body contact 116 is located at P2, P3 or P4. Accordingly, when the body contact 116 is disposed at P2, P3 or P4, the efficiency for collecting holes is higher. In addition, the drain current at P2 to P4 of full-depleted MOS in FIG. 2B is larger than that of partially-depleted MOS in FIG. 2A, such that the thinner silicon layer 104 is more sensitive to the drain current. When the body contact 116 of full-depleted MOS is at P5, the body contact 116 and the drain region 114b are connected, as shown in FIG. 2B. therefore, no simulation regarding to P5 is shown.

Figure 3A:
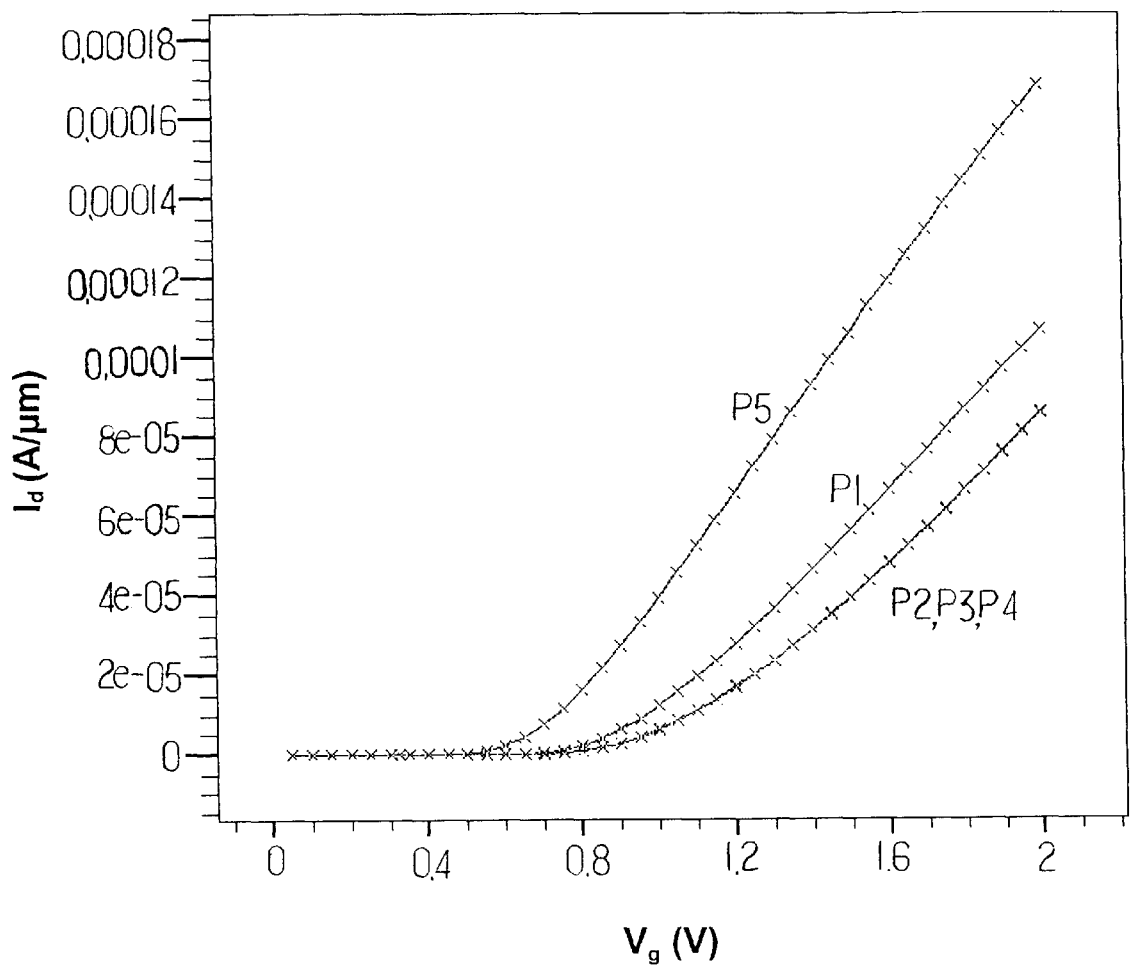
FIGS. 3A–3B, respectively, shows $I_d$–$V_g$ simulated data when a body contact is located at different position from P1 to P5 for partially-depleted and full-depleted N-type MOS transistor formed on SOI when $V_d$=2V.
Figure 3B:
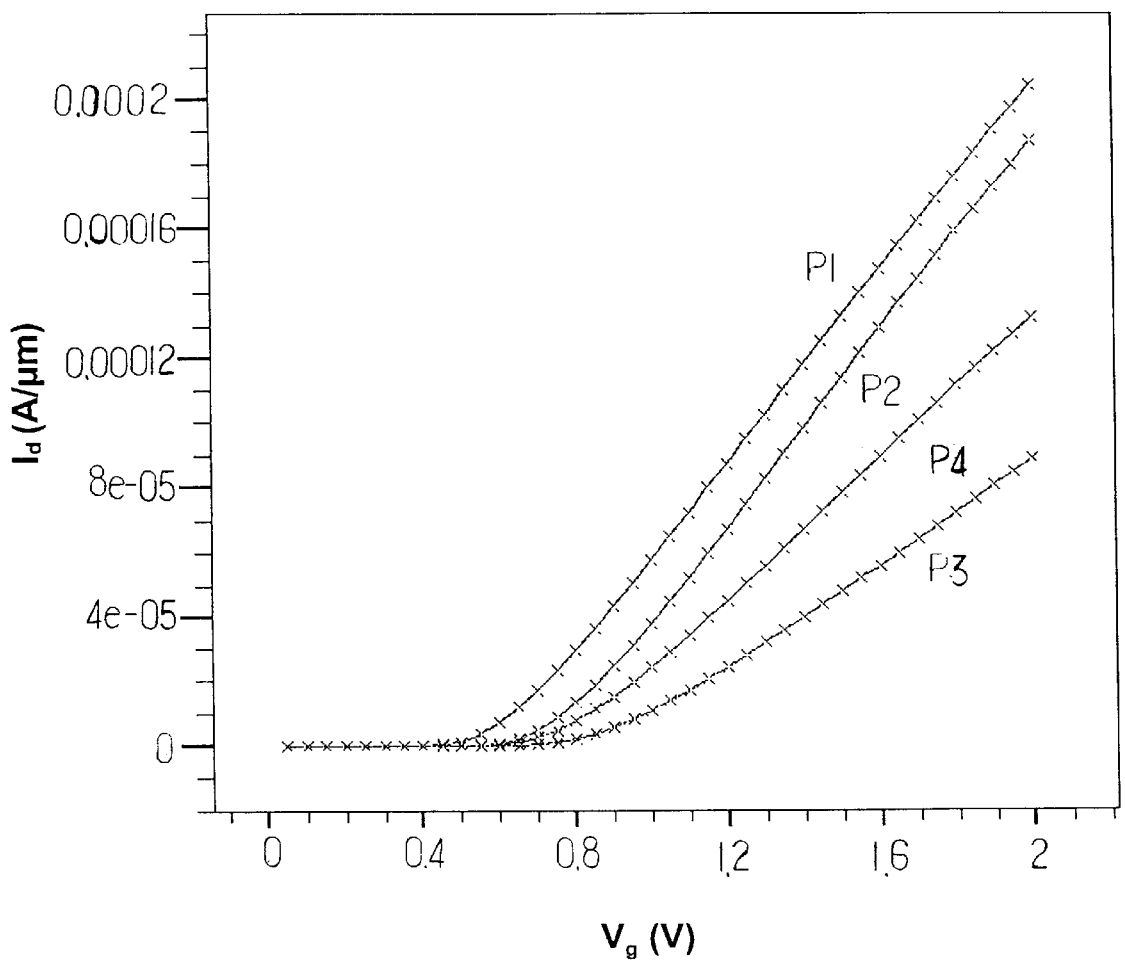

FIG. 3A–3B, respectively, shows $I_d$-$V_g$ simulated data when a body contact is located at different position from P1 to P5 for partially-depleted and full-depleted N-type MOS transistor formed on SOI when $V_d$=2V. As shown in FIG. 3B, the body contact 116 at P3 has the smallest drain current that represents the best ability of collecting holes. However, since the NPN junction (source region 114a/silicon layer 104/drain region 114b), electrons flow from P3 and leads to higher $V_t$ wherein $V_t$ is threshold voltage. On the contrary, the ability of collecting holes as the body contact 116 at P4 is not as well as that at P3, holes accumulate in the bottom of the silicon layer 104 due to NPN junction such that $V_t$ when the body contact at P3 is smaller than that at P4. Therefore, when the body contact 116 is disposed at P1 to P15 in order, $V_t$ is increased first and then decreased.

Figure 4A:
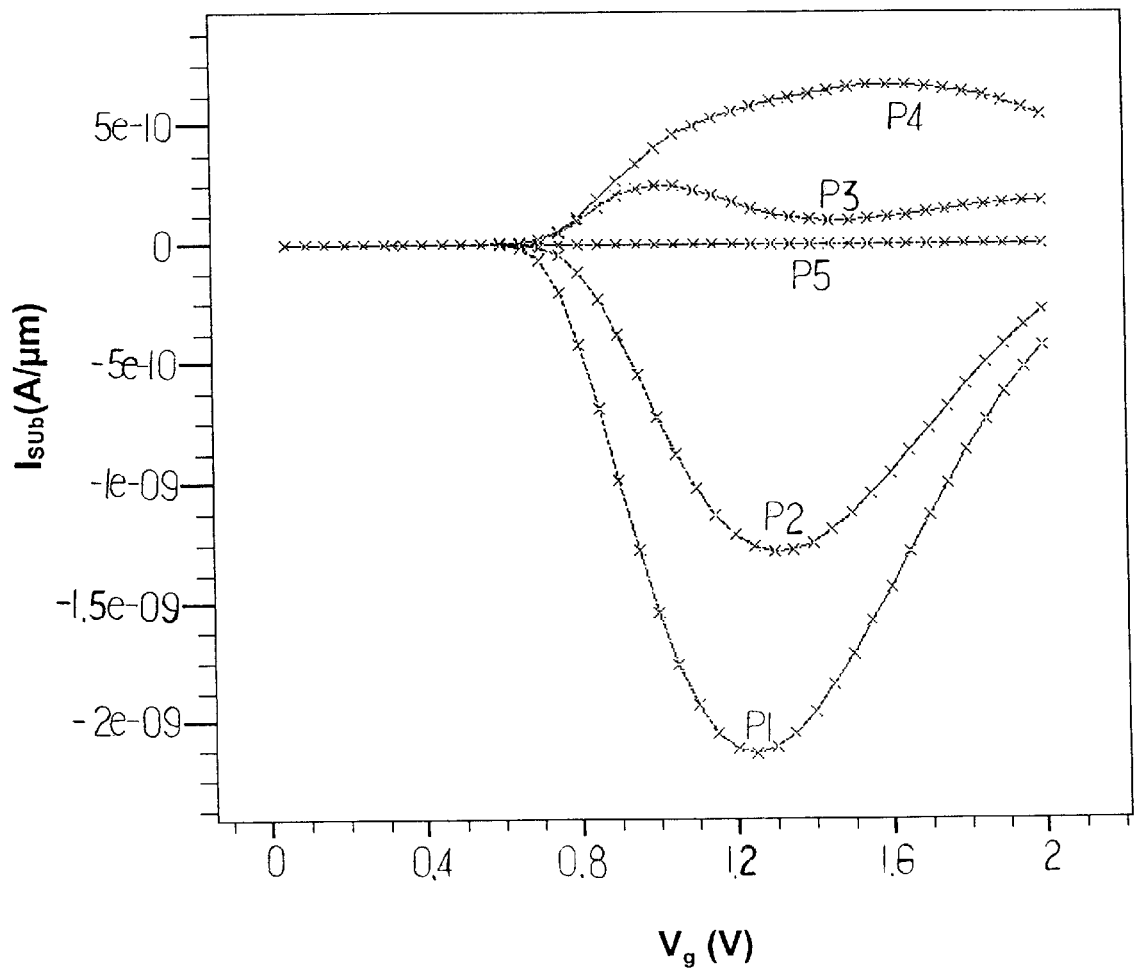
FIGS. 4A–4B, respectively, shows a $I_{sub}$–$V_g$ simulated data when a body contact is located at different position from P1 to P5 for partially-depleted and full-depleted N-type MOS transistor formed on SOI when $V_d$=2V.
Figure 4B:
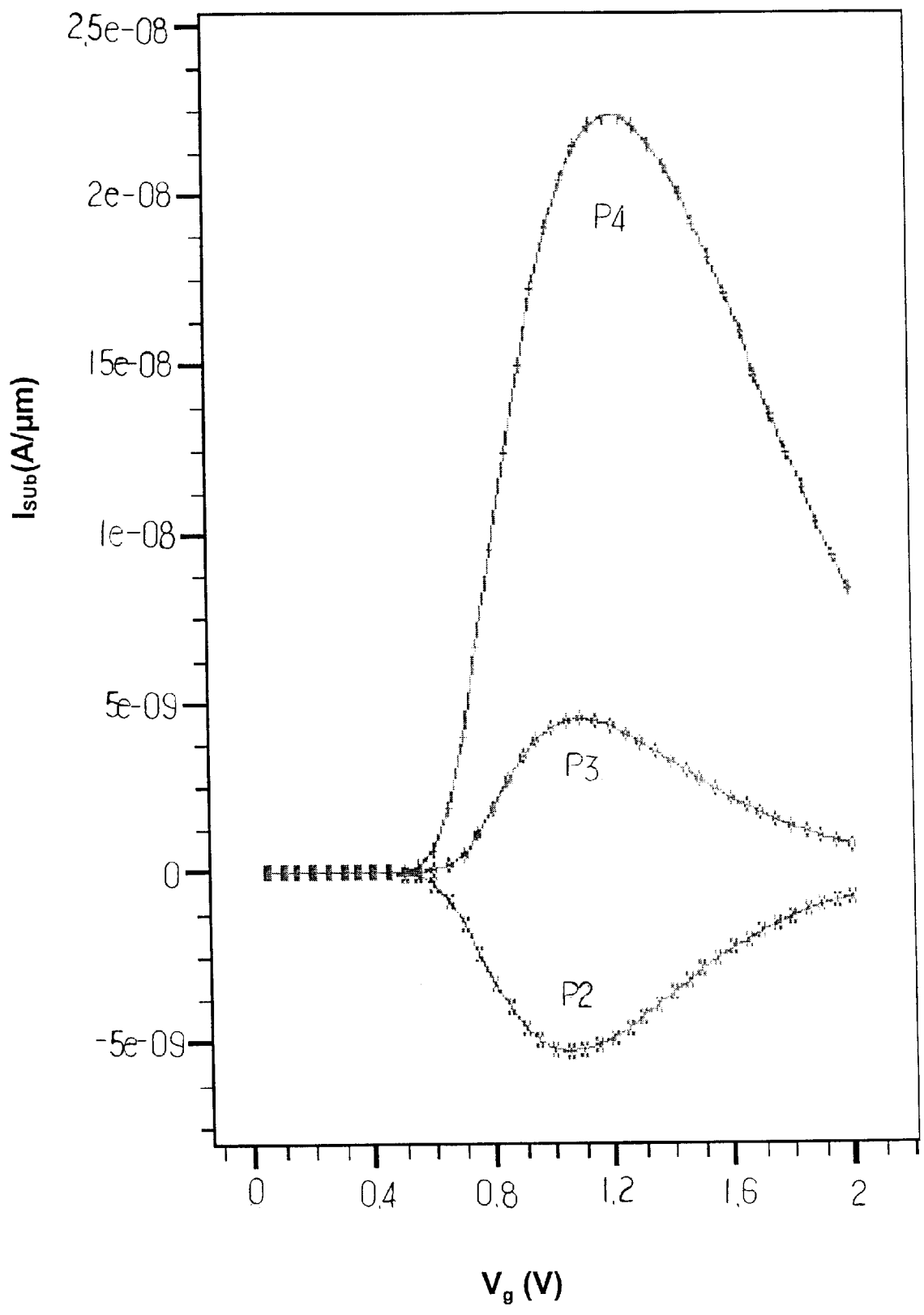

FIG. 4A–4B, respectively, shows a $I_{sub}$-$V_g$ simulated data when a body contact is located at different position from P1 to P5 for partially-depleted and full-depleted N-type MOS transistor formed on SOI when $V_d$=2V wherein $I_{sub}$ represents body contact 116 current. As shown in FIG. 4A, when the body contact 116 is disposed at P1 to P5 in order, $|I_{sub}|$ is decreased first and becomes the minimum when the body contact 116 is at P2. On the other hand, since holes due to impact ionization near the drain region 114b are collected near the body contact 116, $I_{sub}$ becomes positive value when the body contact 116 moves to the direction directed to P3. When the body contact 116 moves to the direction of the drain region 114b, NPN junction becomes obvious and causes electrons discharged.

According to the simulation above, the body contact 116 is preferably disposed at P2 in this preferred embodiment of the invention. That is, the body contact 116 is preferably located at an interface of the insulating layer 102 and the silicon layer 104 between the gate 110 and the source region 114a. Not only the kink effect can be enhanced, but also the contact current and the gate current are reduced and the drain current is larger.

Figure 5A:
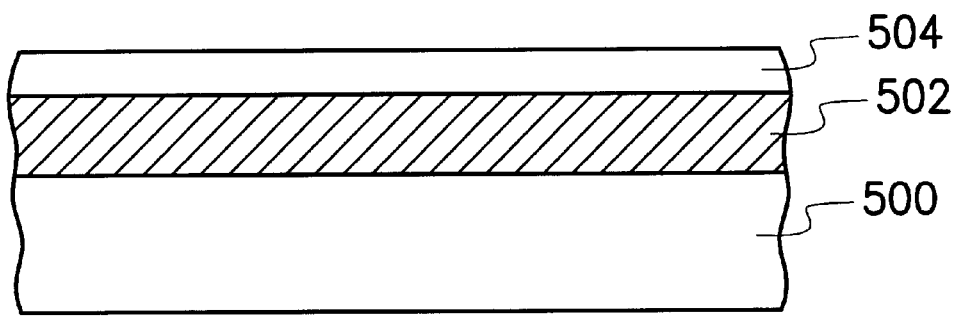
FIGS. 5A–5H show the process flow of SOI structure having a body contact.
Figure 5B:
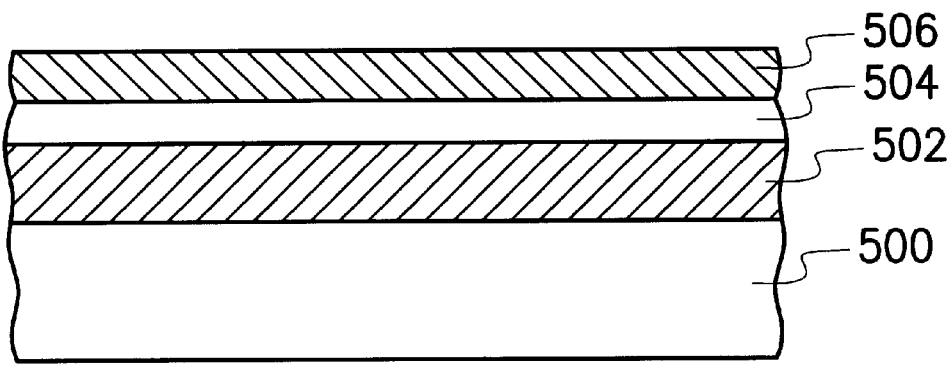
Figure 5C:
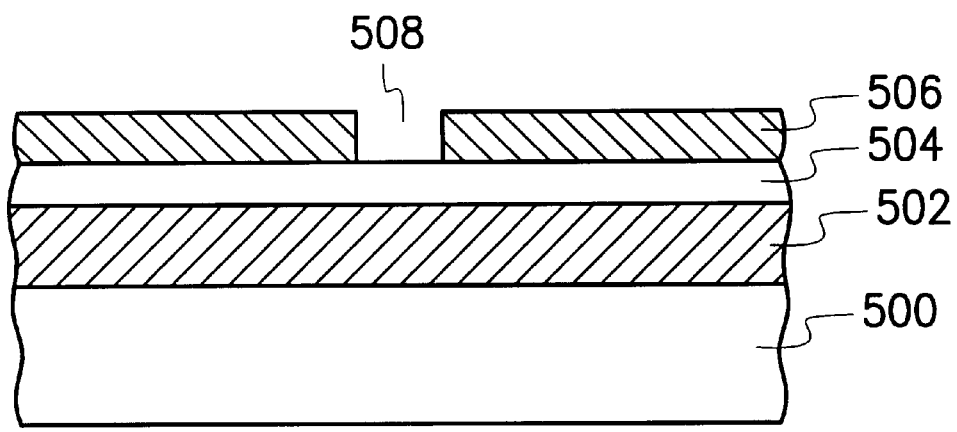
Figure 5D:
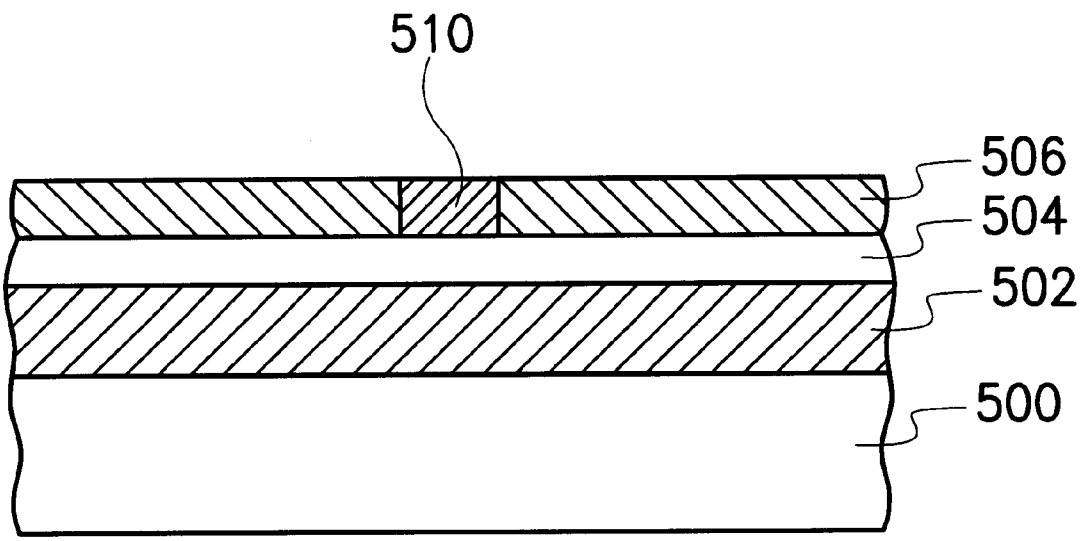

FIG. 5A–5H are schematic, cross-sectional views of SOI process flow having a body contact 116. Referring to FIG. 5A, a porous silicon layer 502 and a silicon layer 504 are successively formed on a silicon substrate 500 such as epitaxial silicon. A thermal oxide layer 506 is then formed on the silicon layer 504 by thermal oxidation, as shown in FIG. 5B. Referring to FIG. 5C, an opening 508 is formed within the thermal oxide layer 506 by a method such as photolithography and etching where the opening 508 is a predetermined position for the body contact in subsequent processes. The opening 508 is then filled with conductive material such as polysilicon to use as a body contact 510, as shown in FIG. 5D. The polysilicon layer is doped with P-type ions as NMOS and with N-type ions as PMOS. That is, the conductivity of the dopants in the polysilicon layer 510 is contrary to the source/drain region of MOS transistor.

Figure 5E:
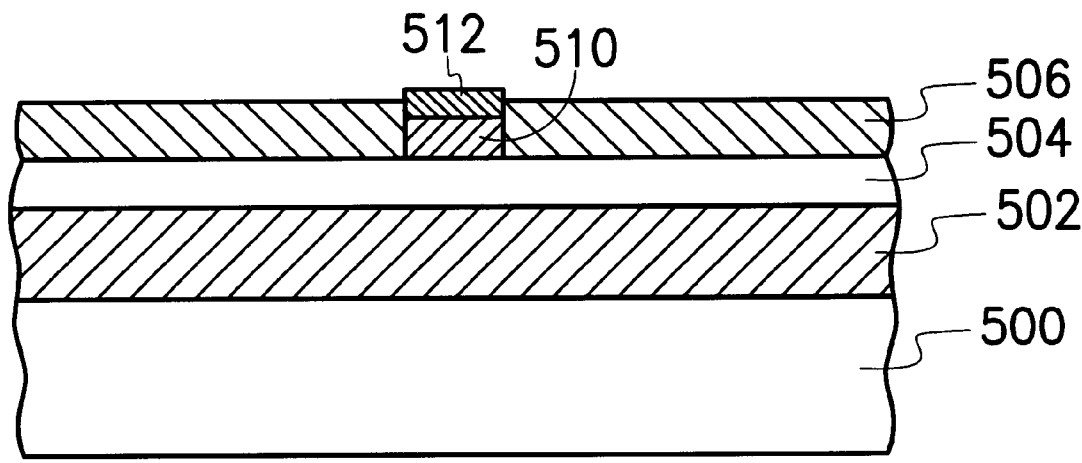
Figure 5F:
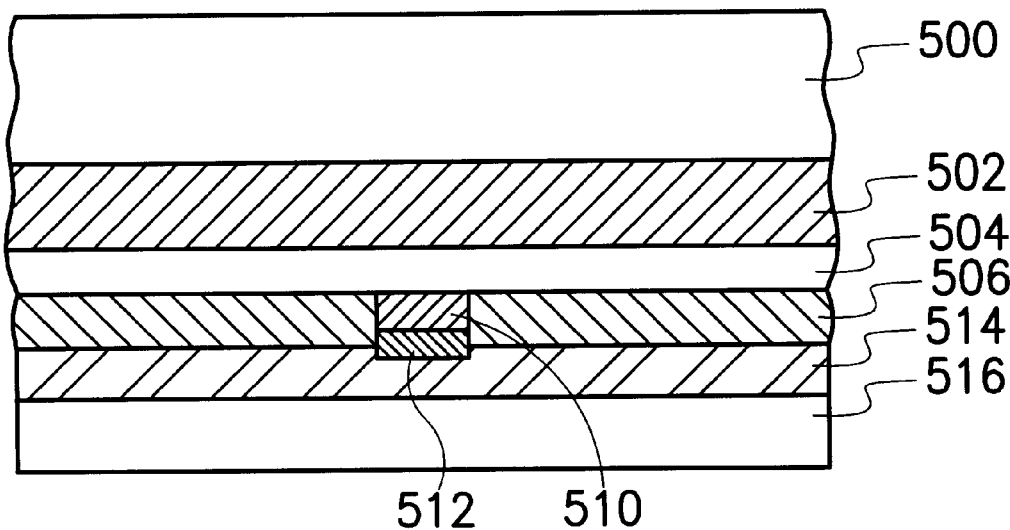
Figure 5G:
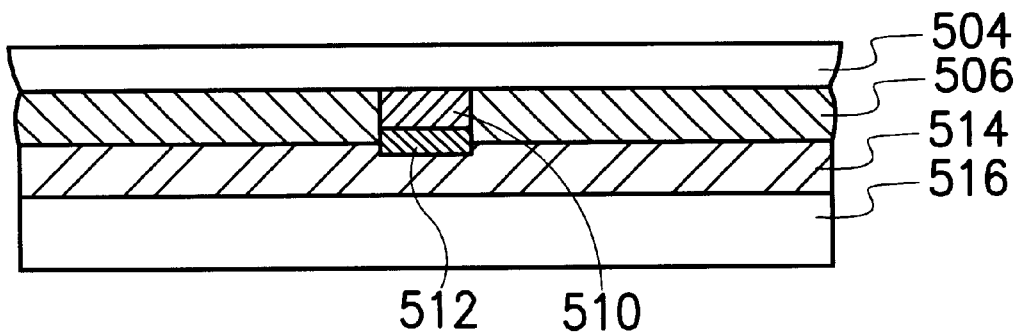

Referring to FIG. 5E, a metal layer such as titanium, tungsten or cobalt is formed on the polysilicon layer 510 and then followed by a rapid thermal annealing process (RTA) so that a metal silicide layer 512 with low resistance is formed to use as a portion of the body contact, thereby increasing the conductivity of the body contact. As illustrated in FIG. 5F, an oxide layer 514 such as TEOS is deposited on the thermal oxide layer 506 and CMP is then performed to polish the oxide layer 514. Thereafter, another substrate 516 is provided to bond with the oxide layer 514 on the substrate 500 to form a structure as illustrated in FIG. 5G.

Figure 5H:
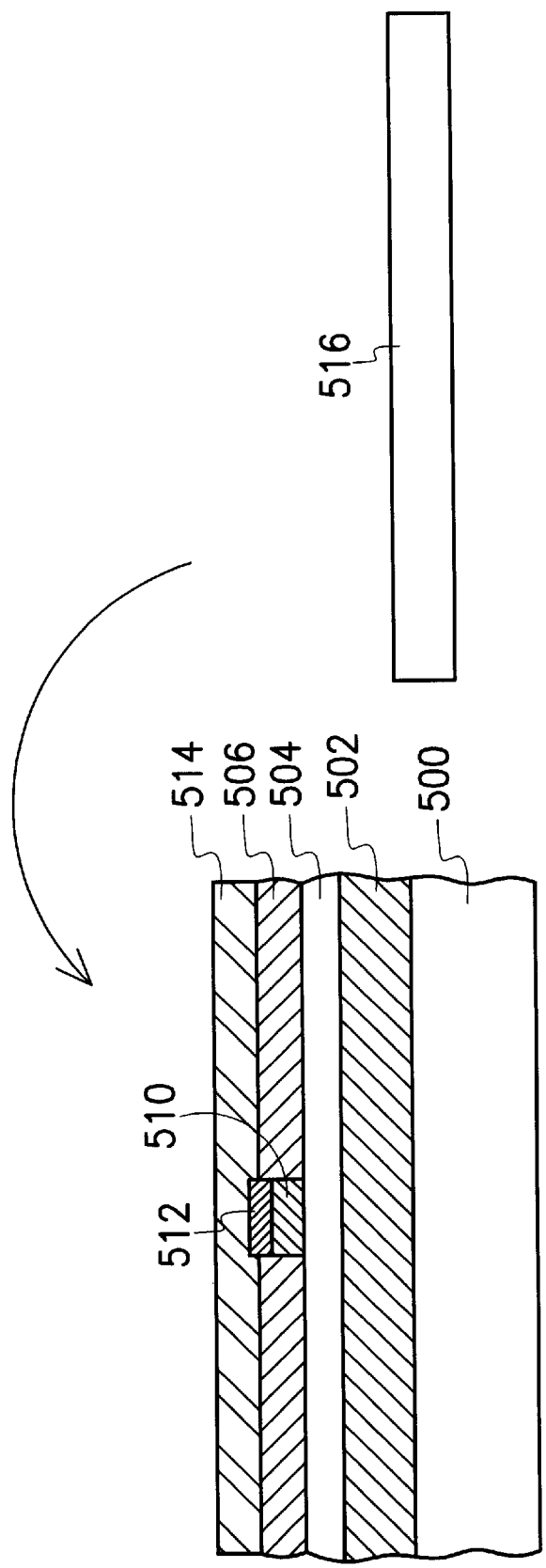

The substrate 500 and the porous silicon layer 502 are removed to obtain a SOI structure having body contact 510 as shown in FIG. 5H. Subsequently, a gate is fabricated using well-know processes. Accordingly, the body contact 116 can be disposed at a proper position such as P1, P2, P3, P4 or P5 to form a device structure as shown in FIG. 1.

The SOI structure having body contact in this invention can be fabricated by other processes, not restricted by the foregoing processes.

The SOI structure having body contact as illustrated in this invention can be applicable in full-depleted MOS transistor or partially-depleted MOS transistor. Full-depleted MOS or partially-depleted MOS is decided by the depth of the source/drain region 114a, 114b or the thickness of the silicon layer 104. When the source/drain region 114a, 114b is deeper and the thickness of the silicon layer 104 becomes thinner, partially-depleted MOS gradually becomes full-depleted MOS.

The body contact in this invention disposed between the silicon layer 104 and the insulating layer 102 can be connected to the interconnect via a wiring line through the contact holes in isolation structure 116 so that the current-voltage characteristic can be enhanced, the body effect is reduced and the performance is therefore improved.

Additionally, in conventional CMOS processes, when two MOS transistors are series-wound, one of the transistors has higher threshold voltage due to body effect as the substrates of the two transistors are connected. In this invention, the body contact of the SOI structure in this invention can be connected to the source region thereof, thereby reducing the body effect.

Therefore, the SOI structure having the body contact in this invention not only can solve Such problems as latch-up or junction capacitance but also enhance the kink effect due to floating substrate and body effect, so that the performance of circuits is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A silicon-on-insulator structure having a body contact, comprising:
    a silicon-on-insulator substrate, comprising a silicon layer formed on an insulating layer;
    a gate, disposed on the silicon layer;
    a source/drain region, disposed within the silicon layer beside the gate; and
    a body contact, disposed within the insulating layers and a portion of the body contact being adjacent to the silicon layer, and the body contact having a width smaller than the width of the gate, wherein a center of the body contact is disposed between a left edge of the gate and a right edge of the source region.

2. The structure according to claim 1, wherein the body contact comprises polysilicon layer.

3. The structure according to claim 2, Further comprises a metal silicide layer disposed on the body contact between the polysilicon layer and the insulating layer.

4. The structure according to claim 2, wherein the doping type of the polysilicon layer is contrary to the source/drain region.

5. The structure according to claim 1, wherein the insulating layer comprises oxide layer.

6. The structure according to claim 1, further comprises a gate oxide layer disposed between the gate and the silicon layer.

\* \* \* \* \*